United States Patent
Tindale et al.

(10) Patent No.: US 8,663,354 B2
(45) Date of Patent: Mar. 4, 2014

(54) AIR FILTER

(75) Inventors: Patrick Arthur Tindale, Nottingham (GB); Stuart Peter Redshaw, Nottingham (GB)

(73) Assignee: 4Energy Ltd, Nottinghamshire (GB)

( * ) Notice: Subject to any disclaimer, the term of this patent is extended or adjusted under 35 U.S.C. 154(b) by 581 days.

(21) Appl. No.: 12/863,398

(22) PCT Filed: Jan. 16, 2009

(86) PCT No.: PCT/GB2009/000130
§ 371 (c)(1),
(2), (4) Date: Aug. 24, 2010

(87) PCT Pub. No.: WO2009/090405
PCT Pub. Date: Jul. 23, 2009

(65) Prior Publication Data
US 2010/0311316 A1    Dec. 9, 2010

(30) Foreign Application Priority Data

Jan. 17, 2008  (GB) .................... 0800824.5

(51) Int. Cl.
*B01D 46/28*        (2006.01)

(52) U.S. Cl.
USPC ............... 55/477; 55/385.2; 55/302; 55/496; 55/511; 55/527; 95/279; 96/66

(58) Field of Classification Search
USPC ........ 55/291, 293, 302, 385.2, 477, 496, 511, 55/527, DIG. 5, DIG. 39, DIG. 45; 95/279; 96/66; 454/184
See application file for complete search history.

(56) References Cited

U.S. PATENT DOCUMENTS

| | | | |
|---|---|---|---|
| 2,027,906 A * | 1/1936 | Hand | ............................. 55/477 |
| 3,977,847 A | 8/1976 | Clark | |
| 4,092,764 A * | 6/1978 | Thomas et al. | ................. 19/107 |
| 4,154,588 A | 5/1979 | Herndon, Jr. | |
| 4,253,855 A | 3/1981 | Jackson et al. | |
| 4,277,266 A | 7/1981 | Dick | |
| 4,808,234 A | 2/1989 | McKay et al. | |
| 4,885,009 A | 12/1989 | Schneider | |
| 5,181,945 A | 1/1993 | Bodovsky | |

(Continued)

FOREIGN PATENT DOCUMENTS

| | | |
|---|---|---|
| DE | 1090498 | 10/1960 |
| EP | 0875275 | 11/1998 |

(Continued)

OTHER PUBLICATIONS

Patentability Examination Report for corresponding Colombian App No. 10.090.186 mailed Oct. 3, 2013.

(Continued)

*Primary Examiner* — Jason M Greene
*Assistant Examiner* — Karla Hawkins
(74) *Attorney, Agent, or Firm* — Billion & Armitage; Benjamin C. Armitage

(57) ABSTRACT

An air filter (111) comprising a duct (118, 120) forming a passageway extending between an inlet (116) and an outlet (113) of the air filter, the duct comprising bristles (310) extending from a wall of the duct across at least a portion of the passageway so as to remove entrained particles from air passing through the duct.

22 Claims, 8 Drawing Sheets

(56) References Cited

U.S. PATENT DOCUMENTS

| | | |
|---|---|---|
| 5,318,606 A | 6/1994 | Geibel et al. |
| 5,492,551 A | 2/1996 | Wolfe |
| 5,522,909 A | 6/1996 | Haggard |
| 5,741,351 A | 4/1998 | Beal et al. |
| 6,916,363 B2 | 7/2005 | Odajima |
| 2008/0006155 A1* | 1/2008 | Sellers et al. ............... 95/282 |
| 2008/0245083 A1* | 10/2008 | Tutunoglu et al. ............. 62/115 |

FOREIGN PATENT DOCUMENTS

| | | |
|---|---|---|
| JP | 48 072767 | 10/1973 |
| JP | 48 099966 | 11/1973 |
| JP | 50 084876 | 7/1975 |
| JP | 55 094612 | 7/1980 |
| JP | 55 102918 | 7/1980 |
| JP | 55 137019 | 10/1980 |
| JP | 56 168229 | 12/1981 |
| JP | 57 199024 | 12/1982 |
| JP | 03-050433 A | 3/1991 |
| JP | 2003-065030 A | 3/2003 |
| RU | 2241910 C1 | 12/2004 |
| RU | 2431088 C2 | 6/2011 |
| SU | 861877 | 9/1981 |
| SU | 1707440 | 1/1992 |
| WO | WO 2008/142414 A1 | 11/2008 |

OTHER PUBLICATIONS

Notice of Reasons for Rejection for corresponding Japanese App No. 2010-542685 mailed Jan. 8, 2013.

* cited by examiner

AIR FILTER

CROSS-REFERENCE TO RELATED APPLICATIONS

The present application is a national stage filing of PCT/GB2009/000130, filed Jan. 16, 2009, which claims priority to GB Patent Application No. 0800824.5, filed Jan. 17, 2008, which are incorporated by reference for any purpose.

FIELD OF THE INVENTION

The invention relates to air filters for use in ventilation and temperature control of, for example, electrical equipment enclosures.

BACKGROUND

Enclosures for electrical equipment typically require ventilation to allow the equipment to expel waste heat to an external environment to avoid overheating. In applications where electrical equipment is to be used in remote locations, for example in mobile radio telecommunications base stations, equipment is typically left unattended for extended periods. To ensure that the temperature of the equipment is kept within a preferred temperature range, additional cooling and ventilation apparatus is normally required. Depending on complexity, this cooling equipment consumes energy, which is both expensive and sometimes in limited supply, and also require maintenance to avoid the costly implications of failure.

In a typical radio telecommunications base station, electrical equipment operating the radio frequency (RF) signals is kept inside a ventilated cabinet, which itself is kept within a sealed equipment room providing protection from external conditions. Often, fans within the cabinet circulate air through the electrical equipment to provide cooling, and the air temperature within the equipment room is maintained through the use of an air conditioning unit, which expels waste heat generated by the electrical equipment to the external environment. The air conditioning unit must work to maintain the temperature of the interior of the room within a desired range, to ensure that the equipment within the room operates reliably. This uses a significant amount of power in addition to that required to operate the electrical equipment itself.

A backup power supply in the form of a cabinet of batteries (typically lead-acid batteries) is often necessary in case of a break in electrical power to the equipment room. Such batteries also need to be kept within a desired temperature range, this range being generally more stringent than for other electrical equipment. In a typical equipment room therefore, the air conditioning unit often operates to maintain an internal temperature range dependent upon the requirements of the batteries rather than of the electrical equipment, which is generally able to operate at higher temperatures without any problems. This results in the air conditioning unit having to work harder than is strictly necessary to maintain proper operation of all equipment in the room.

In temperate climates such as in the UK, the ratio of cooling power to equipment power is approximately 1 to 4. So if 4 kW is used by the electronics 1 kW will typically be required by the cooling system. In hotter climates this ratio may reduce to 1 to 3 or even 1 to 2. Clearly in summer the actual day to day consumption may be much higher, but these loads may be offset to some extent in winter.

Therefore an air conditioning unit in a typical equipment room may operate at up to 1 kW, compared with the operating power of the other electrical equipment of up to 4 kW. This requirement can be reduced by providing for separate cooling of the battery backup, allowing the internal temperature of the room to rise to a higher maximum temperature. For example, ensuring the whole room is kept at a temperature of below 20° C. to accommodate battery requirements will tend to use substantially more power than allowing the maximum temperature to rise to 35° C., at which temperature most electrical equipment will still operate without problems. This does not, however, remove the need for air conditioning of such rooms, as some cooling will still be required to prevent the maximum temperature from being exceeded under certain conditions.

A further problem with using air conditioning units in equipment rooms, particularly when such rooms are in remote locations, is that of servicing and repairing. If an air conditioning unit breaks down in use, the electrical equipment is put at risk of failure, and a specialist engineer (usually different from an electrical equipment engineer) must be called out to fix the unit. This can substantially add to the cost of maintaining such equipment rooms. It might also not be known, for example when an equipment room provides an automatic failure indication, what has caused the failure. An electrical equipment engineer could therefore be called out, when what is required is an air conditioning engineer. Multiple visits can then further add to the costs of maintaining operation.

One common alternative approach is, instead of keeping the equipment room sealed and refrigerated, to maintain a high air flow through the room by means of a large fan arranged to force air through air vents provided in the room. To maintain a desired temperature range, however, and to minimise a temperature differential between the interior and exterior of the room, a large airflow is required, requiring a large and powerful fan. Furthermore, air being drawn through the room will tend to draw dirt and dust from the external environment into the room, so the airflow will need to be filtered. Adding filters will inevitably result in a requirement for maintenance visits to check and replace the filters so that a sufficiently high airflow can be maintained. Simply replacing air conditioning with fan cooling does not therefore fully address the problem of requiring separate maintenance visits, nor does it necessarily substantially reduce the power requirements of the room, since large fans require large power inputs. High airflows also tend to draw in more dirt and dust, causing filters to eventually clog.

An improved alternative to the use of air conditioning or large fans is to direct heat generated by the electrical equipment within the room to the external environment, for example by using exhaust ducts extending from the equipment cabinets to the outside wall of the room. Air drawn into the equipment cabinet by an internal fan can then be exhausted to the external environment more directly, reducing heating of the room by heat generated by the electrical equipment. This results in a much reduced need for airflow through the room. Smaller fans, with much reduced power requirements, can then be used to extract air from the room, replacing the air through intake vents in the room.

The above solution does not, however, remove the need for maintenance visits, because air filters will still be required in the intake vents in the room, and these will occasionally need to be replaced.

It is an object of the invention to address one or more of the above mentioned problems.

SUMMARY OF THE INVENTION

According to the invention there is provided an air filter comprising a duct forming a passageway extending between an inlet and an outlet of the air filter, the duct comprising bristles extending from a wall of the duct across at least a portion of the passageway so as to remove entrained particles from air passing through the duct.

The air filter may comprise part of an equipment room, in which an air inlet passageway is arranged to be mounted to allow air to flow vertically upwards through the air inlet passageway so that entrained particles are removed by the bristles in the inlet passageway, allowing the particles to drop out of the inlet passageway through the action of gravity.

The air filter preferably has an inlet area that is substantially larger than the outlet area, so that air is drawn in through the inlet passageway and past the bristles at a low speed, to allow entrained particles to be prevented from passing by the bristles and to drop out of the air filter by the action of gravity.

Advantages of the invention include one or more of the following:

i) no moving parts are required in the air filter itself, reducing the need for maintenance;
ii) the air filter can be arranged to be self-cleaning, further reducing maintenance requirements due to the lack of need for replacement filters;
iii) the air filter allows for a much reduced power requirement for ventilation and cooling, allowing either a lower temperature difference between the interior and exterior of an equipment room for a given airflow or a reduced airflow for the same temperature difference; and
iv) the air filter can be retro-fitted to existing equipment rooms, effectively replacing existing air conditioning units (provided certain other modifications are made).

DETAILED DESCRIPTION

The invention will now be described by way of example and with reference to the accompanying drawings, in which.

Figure 1:
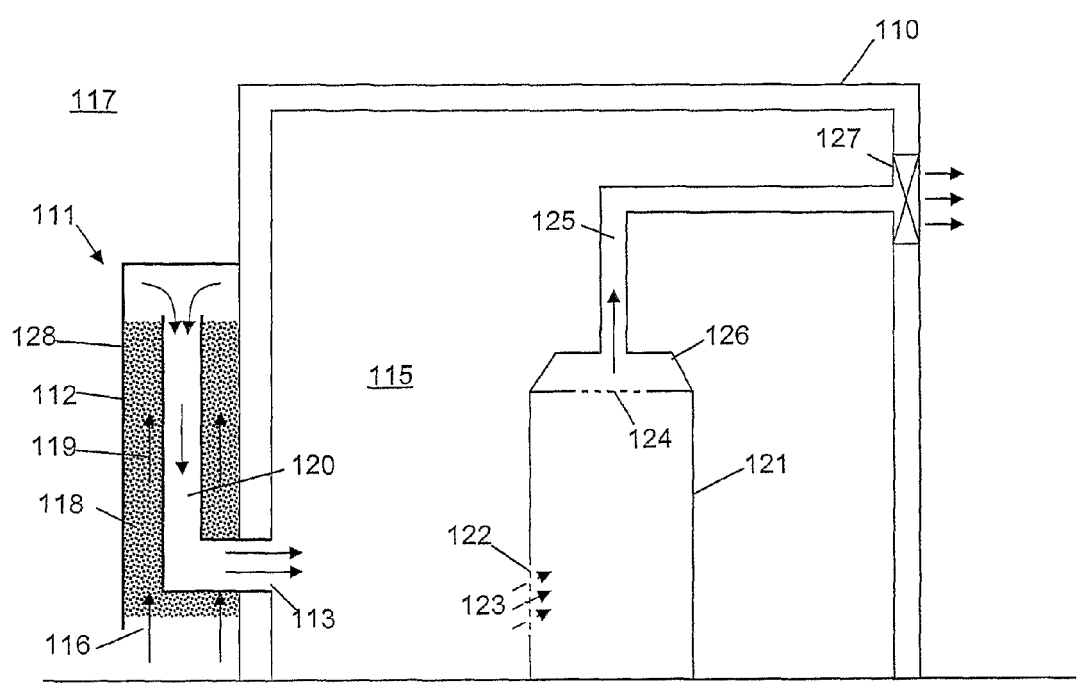
FIG. 1 illustrates in schematic cross-section an equipment room having air cooling.

Illustrated in FIG. 1 is a schematic cross-sectional view of an equipment room 110 comprising an exemplary air filter 111. The air filter 111 is provided in the form of a wall-mounted enclosure 112, with an air outlet 113 extending into an internal volume 115 of the room 110, and a wider air inlet 116 configured to allow air to be drawn from the external environment 117 through a duct comprising in series an inlet passageway 118 and an outlet passageway 120 extending between the inlet 116 and outlet 113 of the air filter 111, with the direction of airflow indicated by arrows 119.

The air filter 111 is preferably mounted on the room 110 such that the inlet passageway 118 is oriented to allow airflow 119 vertically upwards through the inlet passageway 118, and then vertically downwards through an air outlet passageway 120 towards the air outlet 113. The outlet passageway 120 is preferably provided within the inlet passageway 118, as shown in more detail below, although other arrangements are also possible.

Shown within the internal volume 115 of the room 110 is an electronic equipment enclosure 121. An air inlet vent 122 is provided to allow air from the internal volume 115 to enter the enclosure 121, the airflow indicated by arrows 123. A further air vent 124 is provided to allow air to exit the equipment enclosure 121 and into an air exhaust duct 125 via a hood 126 on top of the enclosure 121. An exhaust fan 127 forces air out of the duct 125 and out to the external environment 117. The fan 127 thereby provides a driving force, in the form of a partial vacuum created within the internal volume 115, to draw air from the external environment 117 into the internal volume 115 through the air filter 111. Provided the room 110 is otherwise sufficiently sealed, the fan 127 alone can provide all the air flow through the room 110 required to provide cooling of the internal volume 115 and of equipment within the enclosure 121. Because air from the equipment enclosure 121 is prevented from recirculating within the internal volume 115, the requirement for cooling within the room 110 is reduced, as compared with conventional solutions involving air conditioning of the whole internal volume 115.

A filtration medium 128 is provided within the air filter 111 extending across and filling at least a portion of the inlet passageway 119. The filtration medium 128 comprises bristles extending from a wall of the duct across at least a portion of the inlet passageway 119 so as to remove entrained particles from air passing through the duct. Preferred arrangements of bristles are described in further detail below.

Preferably the outlet passageway 120 has a smaller bore than the inlet passageway 119, so that the speed at which air flows into the air filter is sufficiently low to allow dirt and debris to be prevented from passing through to the outlet passageway, and to instead fall out of the inlet 116 or at least remain trapped by the filtration medium. Preferably the cross-sectional area of the duct reduces from a maximum at the inlet 116 to a minimum at the outlet 113, corresponding to an increase in air speed through the filter 111 from a minimum at the inlet 116 to a maximum at the outlet 113.

Figure 2:
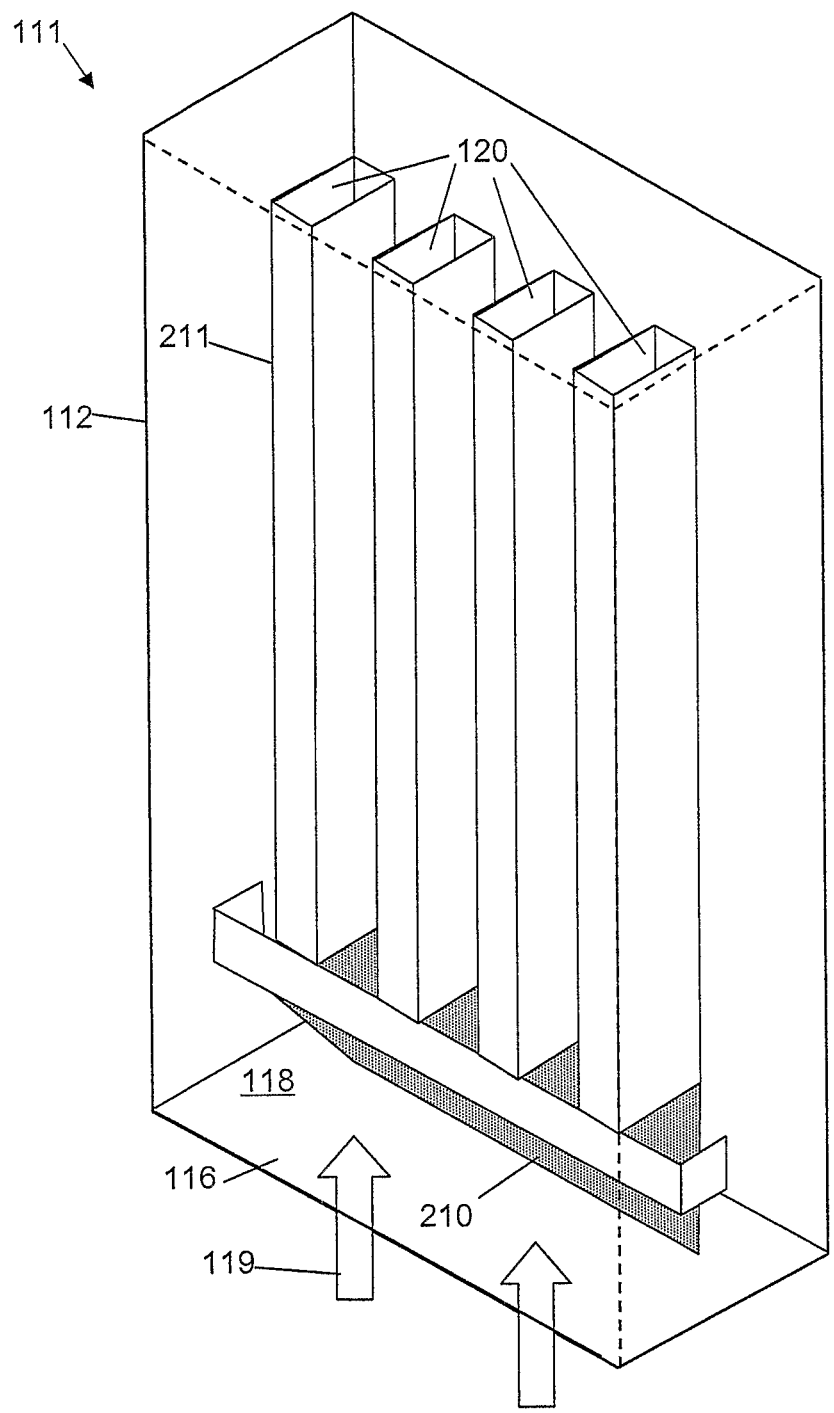
FIG. 2 illustrates a partial schematic isometric view of an exemplary air filter.

Illustrated in FIG. 2 is a preferred arrangement of inlet and outlet passageways 118, 120 that together comprise the duct extending between the inlet 116 and outlet 113 of the air filter 111. In FIG. 2 multiple outlet passageways 120 provided by a plurality of tubular sections 211 in a parallel arrangement. The multiple outlet passageways 120 are connected together towards the outlet of the air filter (not visible in FIG. 2) by means of a manifold 210. Air flows upwards, indicated by arrows 119, through the inlet passageway 188, around and between the tubular sections 211 and through the filtration medium (not shown), then downwards through the multiple outlet passageways 120, through the manifold 210 and towards the outlet of the air filter 111.

Figure 3:
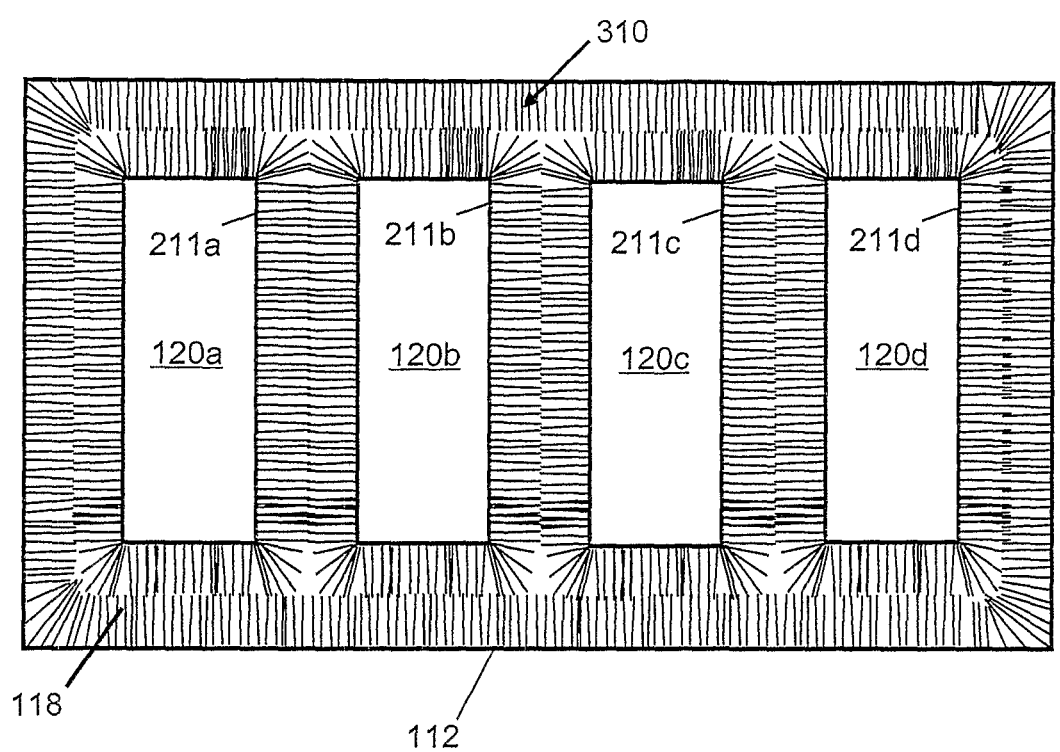
FIG. 3 illustrates a schematic cross-sectional representation of an inlet passageway of an exemplary air filter.

A schematic cross-sectional view across the inlet and outlet passageways 118, 120 of the air filter 111 of FIG. 2 is shown in FIG. 3. An arrangement of bristles 310 extends from an internal wall of the enclosure 112 around the inlet passageway 118, and from external walls of each of the tubular sections 211a-d forming the outlet passageways 120a-d. The bristles 310 preferably extend across the whole of the inlet passageway 118, so that airflow through the passageway 118 is forced to travel at a steady rate through the inlet passageway 118.

The definition of the term 'bristles' used herein is intended to encompass fibres composed of a flexibly resilient material and attached at one end to a base material. The bristles attached to such a base material are preferably together in the form of a carpet, such that the bristles are free standing with the base material in any orientation. The carpet is preferably in the form of artificial turf, which is formed of polymeric fibres, typically of the order of several centimeters long, threaded through and attached to a flexible rubberised matting. The bristles may be in the form of single threads, or may be fibrillated to provide multiple ends from each bristle attachment point, thereby increasing the filtering ability of the bristles.

As shown in FIG. 3, the bristles 310 extend in a substantially radial direction relative to the walls of the duct, over at least a portion of the inlet passageway 118. The bristles in FIG. 3 are shown extending radially from both the internal surface of the enclosure 112 and from the external surfaces of the tubular sections 211a-d to traverse the inlet passageway 118. Alternative arrangements are possible where bristles extend from either the internal surface of the enclosure alone, e.g. in conjunction with a single outlet passageway, or from the external surface(s) of the tubular section(s), depending on the size of the air filter 111.

The bristles are preferably oriented transverse to the general direction of air flow through the inlet passageway, and preferably around 90 degrees to the direction of air flow. As air passes vertically into the filter 111 and through the inlet passageway 118, dirt and debris passing with the air settles out before passing all the way through the inlet passageway 118 through the action of gravity. Accumulated dirt will then gradually fall out of the filter 111 due to gravity, and against the flow direction of the inlet air. Dirt is thereby able to exit the filter completely during normal operation.

The overall size of the air filter 111 will be largely determined by the constraint on air flow speed through the inlet passageway 118, which is in turn dependent upon the cooling requirements of the equipment room 110. For a typical equipment room, for example for use in a radio telecommunications base station, the air flow inlet speed is typically no greater than 1 m/s through the inlet passageway. This is considerably slower than a typical speed of 5 m/s or more for a conventional air filter, for example used in conjunction with a large mass flow fan. However, where space requirements are more critical, higher air flows may be required provided some filtration is still possible. In such situations the air filter described herein may be used as a prefilter in an overall system having higher levels of downstream filtration, for example in a system that does not have directed air flow in equipment cabinets 121 within the room 110.

Although preferred embodiments of the air filter 111 are effectively self-cleaning under normal circumstances, alternative embodiments may comprise other means of cleaning the filtration medium within the inlet passageway 118. One such embodiment is illustrated, in schematic cutaway view, in FIG. 4. The air filter 411 comprises a water drainage system, in which water (e.g. from rain) passes through a perforated sloping roof 420, allowing water to pass through the inlet passageway 418 and into a drain 430. A water trap 440 is provided to prevent air from being drawn through the drain 430.

Figure 4:
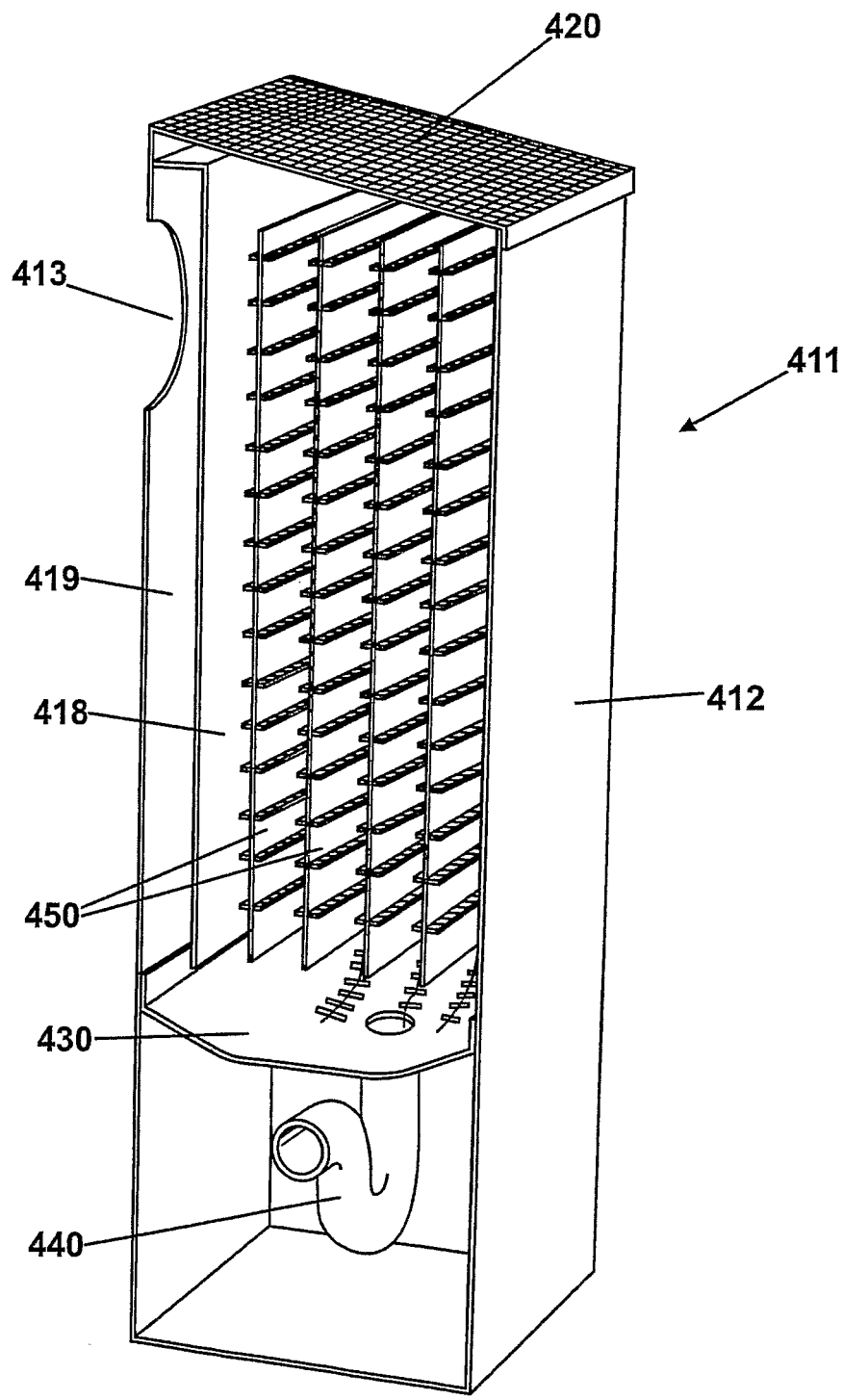
FIG. 4 illustrates a schematic cut-away view of an alternative exemplary air filter configuration.

The embodiment shown in FIG. 4 also illustrates an alternative arrangement for filtration medium in the air inlet passageway, which in this case is provided by carpets of bristles (not shown for clarity) attached to vertically oriented panels 450. The air outlet passageway 419 is arranged over to one side of the enclosure 412. In normal use, air enters the filter 411 through the roof 420, passing vertically downwards through the carpets of bristles provided between and around the panels 450, and then upwards through the outlet passageway 419, exiting through the outlet 413. Dirt and debris trapped by the bristles is intermittently washed through the inlet passageway 418 and into the drain 430.

Arrangements of panels providing support for carpets of bristles, as shown in FIG. 4, may alternatively be used in conjunction with embodiments of air filters arranged to operate as described in relation to FIGS. 1 to 3, i.e. where air passes vertically upwards through the inlet passageway.

Figure 5:
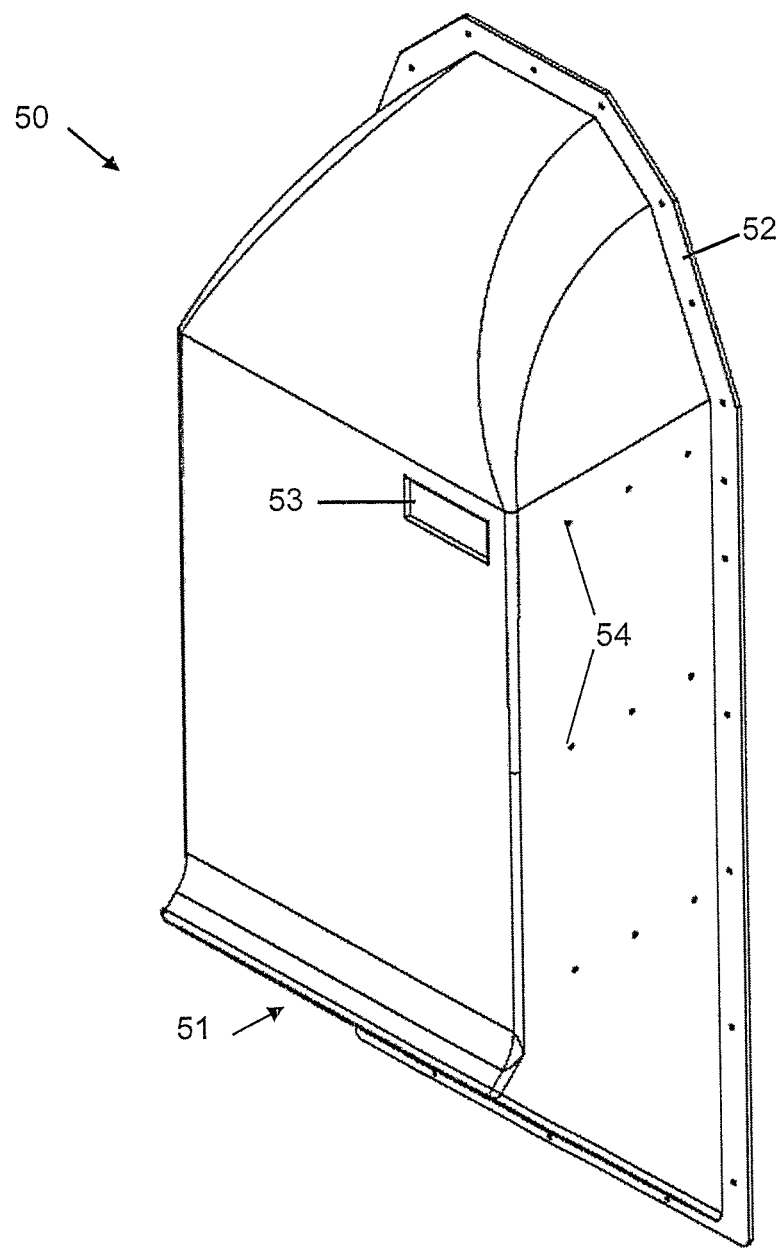
FIG. 5 is a perspective view of an exemplary air filter body.
Figure 6A:
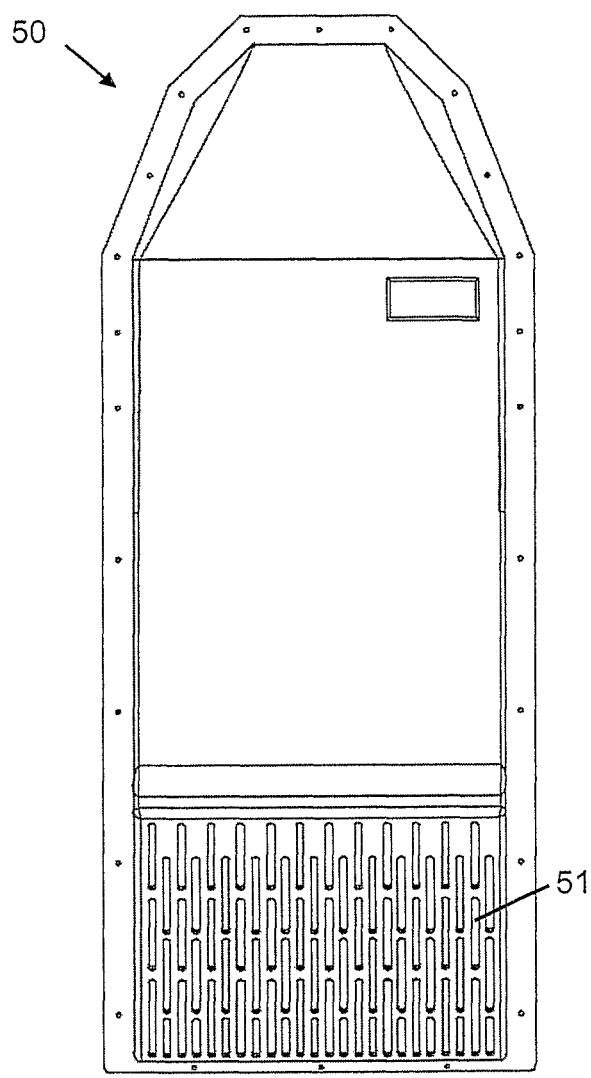
FIG. 6a is an elevation view of the air filter body.
Figure 6B:
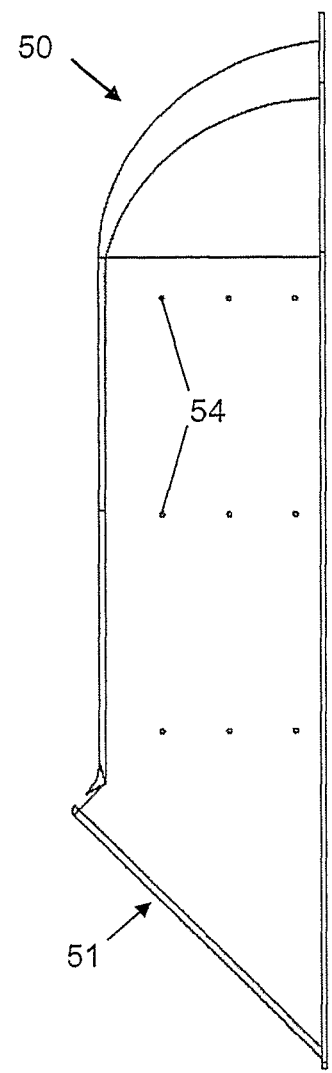
FIG. 6b is a side view of the air filter body.

Illustrated in FIGS. 5, 6a and 6b are perspective, elevation and side views respectively of an exemplary body for an air filter according to the invention. The filter body 50 is in the form of a single piece moulded component, for example fabricated by vacuum forming of a polymeric material such as ABS. The material from which the body 50 is made is preferably heat resistant and fire retardant, and able to withstand extremes of temperature and environmental conditions.

The body 50 is provided with a flanged portion 52 for mounting the air filter on to an external wall of an equipment room such as a telecommunications cabin, and is provided with a series of mounting points 54 for mounting panels inside the internal volume of the filter body 50, the panels having bristles arranged thereon to trap particulates passing through the filter.

An inlet 51 is defined by an angled portion of the filter body 50, along which is provided an array of inlet holes to allow air to enter. The inlet is angled to increase the cross-sectional area of the inlet, thereby slowing the inlet air velocity and improving the ability of the filter to capture particulates. A preferred angle between the plane of the air inlet 51 and the back face of the filter body, or the direction of air travel through the main body of the air filter, is around 45 degrees.

A viewing window 53 may be provided, positioned towards the top of the body to allow the internal volume to be inspected. This allows the extent to which particulates are being removed to be inspected. If bristles visible through the inspection window are clean, the filter may still be operational, even if the bristles lower down that are visible through the air inlet 51 are not clean, provided of course that the filter is not blocked. Over time, as dry material accumulates on the lower portions of the bristles, this accumulated material will tend to fall off the filter and avoid the filter becoming blocked. In some circumstances, however, for example in extremely dusty and dirty environments, the filter may need occasional cleaning, which can be carried out by removing the filter from the cabin to which it is mounted and washing parts of the filter down to remove all accumulated material.

Figure 7:
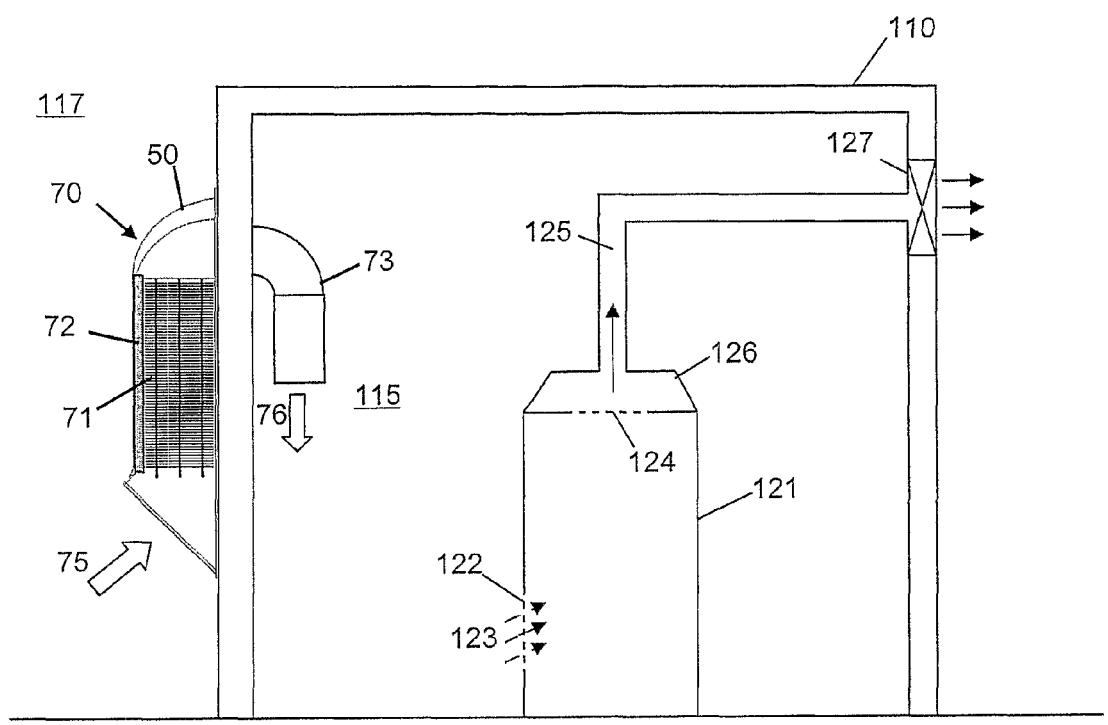
FIG. 7 is a schematic diagram of an equipment room comprising an exemplary air filter inlet arrangement.

Illustrated in FIG. 7 is schematic diagram of an alternative form of equipment room 110 fitted with an exemplary air filter 70 comprising a filter body 50 as described above. Air enters the filter 70 through the angled inlet 51 in the direction indicated by arrow 75. The air filter 70, mounted to the external wall of the enclosure, comprises a number of plates 71 having outwardly extending bristles, the plates 71 being mounted within the body 50 and aligned vertically, i.e. substantially in the direction of air flow through the filter 70. An air outlet 73 extends into the internal volume 115 of the room 110, allowing air to enter the room vertically downwards, in the direction indicated by arrow 76.

As with other embodiments, the air inlet 51 is substantially greater in cross-section than the air outlet 73, resulting in a reduced air inlet velocity that allows the air filter to capture more particulates from air that is being drawn through the filter.

An insulation panel 72 may be provided on an internal surface of the air filter body, which serves two main purposes. Firstly, the thickness of the insulation panel 72 allows for accommodation of different types of filtering media to be mounted on the filter panels 71. Secondly, the insulation panel 72 reduces heat from the external environment, in particular resulting from solar gain, being transmitted through to the air passing through the filter. The insulation panel may be in the form of an aluminium foil faced expanded rigid polystyrene sheet, as commonly used for building insulation.

Figure 8:
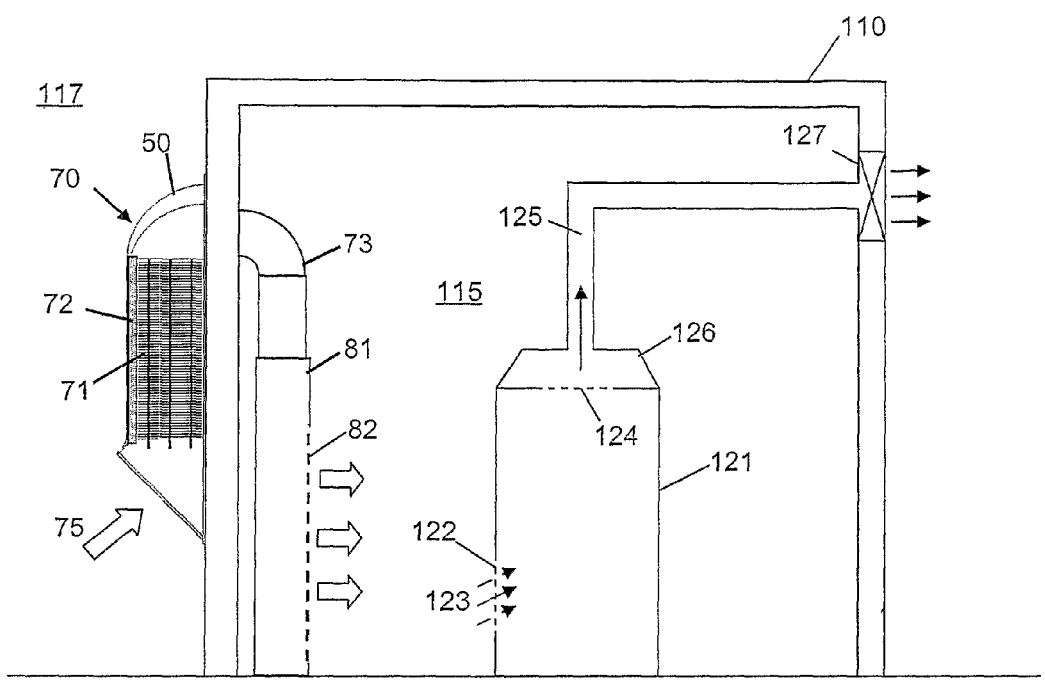
FIG. 8 is a further schematic diagram of an equipment room comprising an exemplary air filter inlet arrangement.

In the embodiment shown in FIG. 7, air passes through the filter vertically upwards and then enters the internal volume 115 of the room 110 vertically downwards. This has the advantage that a further space is allowed for interfacing with additional cooling equipment, if required. As shown in FIG. 8, an evaporator unit 81 may be connected to the air outlet 73 between the outlet and the floor of the room 110, to provide additional cooling to air entering into the room. The evaporator 81 is connected to an externally-mounted heat exchanger unit (not shown), which is preferably located away from the air inlet 51. To maximise cooling efficiency, the evaporator 81 has an outlet vent 82 having a larger area than the filter air outlet 73 so that air is slowed down after passing through the filter and before entering the internal volume 115 of the room 110. This allows a longer period for heat to be extracted from the air while passing through the evaporator unit 81. Over-cooling of air results in wasted energy, so the evaporator unit 81 is preferably configured to be operated only when a predetermined threshold air temperature within the room 110 is exceeded.

Additional filtering may also be added to the air outlet 73 if a finer degree of filtration is needed, for example to filter out fine micron-scale particulates that are not removed by the filter 70. An additional air filter may be added in line with the outlet, optionally in conjunction with an evaporator 82.

Other embodiments are within the scope of the invention, as defined by the appended claims.

The invention claimed is:

1. An air filter comprising a duct forming a passageway extending between an inlet and an outlet of the air filter, the duct comprising bristles extending from a wall of the duct across at least a portion of the passageway so as to remove entrained particles from air passing through the duct, wherein the duct comprises an inlet passageway in series with an outlet passageway, and wherein the outlet passageway has a smaller bore than the inlet passageway.

2. The air filter of claim 1 wherein the inlet passageway being lined with bristles extending across the inlet passageway over at least a portion of a length thereof.

3. The air filter of claim 2 wherein the inlet passageway surrounds the outlet passageway.

4. The air filter of claim 3 wherein a cross-sectional area of the duct reduces from a maximum at the inlet to a minimum at the outlet of the air filter.

5. The air filter of claim 4 wherein the inlet passageway comprises bristles extending radially outwards from a wall of the duct over at least a portion of the inlet passageway.

6. The air filter of claim 5 wherein the inlet passageway comprises bristles extending radially inwards from a wall of the duct over at least a portion of the inlet passageway.

7. The air filter of claim 6 wherein the bristles are provided by artificial turf lining at least a portion of the duct.

8. The air filter of claim 2 wherein the inlet passageway has an air flow area that is at least two times greater than a smallest air flow area of the outlet passageway.

9. The air filter of claim 7 wherein the bristles extend laterally across the passageway.

10. The air filter of claim 9 wherein the bristles traverse the passageway.

11. The air filter of claim 9 wherein the bristles extend in a direction substantially orthogonal to a direction of air flow through the passageway.

12. The air filter of claim 9 wherein the bristles extend from one or more plates disposed within the duct.

13. The air filter of claim 12 wherein the one or more plates are aligned with a direction of air flow through the duct.

14. An equipment room comprising an interior and an air filter including a duct forming a passageway extending between an inlet and an outlet of the air filter, the duct comprising an inlet passageway in series with an outlet passageway, the inlet passageway being lined with bristles extending from a wall of the duct across the inlet passageway over at least a portion of a length thereof, wherein the bristles are orientated transverse to the general direction of air flow through the inlet passageway, wherein the inlet passageway is arranged to allow air to be drawn into the equipment room vertically upwards through the inlet passageway from an exterior environment and towards the interior of the room, and wherein the bristles are configured to remove entrained particles from air passing through the duct and allow the removed entrained particles to drop out of the inlet passageway through the action of gravity.

15. The equipment room of claim 14 comprising an evaporator unit connected in line with the outlet passageway of the air filter and configured to cool air passing from the air filter into an internal volume of the equipment room.

16. The equipment room of claim 15, wherein the outlet passageway has a smaller bore than the inlet passageway.

17. The equipment room of claim 16, wherein the internal volume of the equipment room includes at least one of RF electrical equipment and batteries.

18. The equipment room of claim 14, wherein the outlet passageway has a smaller bore than the inlet passageway.

19. The air filter of claim 2, wherein a cross-sectional area of the duct reduces from a maximum at the inlet to a minimum at the outlet of the air filter, wherein the inlet passageway comprises bristles extending radially outwards from a wall of the duct over at least a portion of the inlet passageway; wherein the inlet passageway comprises bristles extending radially inwards from a wall of the duct over at least a portion of the inlet passageway; and wherein the bristles are provided by artificial turf lining at least a portion of the duct.

20. The air filter of claim 2 wherein the inlet passageway comprises bristles extending radially inwards from a wall of the duct over at least a portion of the inlet passageway; wherein the bristles are provided by artificial turf lining at least a portion of the duct; wherein the inlet passageway includes an air flow area that is at least two times greater than a smallest air flow area of the outlet passageway; wherein the bristles extend laterally across the passageway; and wherein at least one of the plates is aligned in the direction of airflow.

21. The equipment room of claim 14, wherein dirt is thereby able to exit the air filter completely during normal operation.

22. The air filter of claim 1 comprising a single outlet passageway.

* * * * *